United States Patent
Lin

(10) Patent No.: US 6,317,327 B1
(45) Date of Patent: Nov. 13, 2001

(54) DIODE COOLING ARRANGEMENT

(76) Inventor: Chin-Feng Lin, 3F., No. 2, Lane 8, Fu Yuan Street, Hsintien, Taipei Hsien (TW)

( * ) Notice: Subject to any disclaimer, the term of this patent is extended or adjusted under 35 U.S.C. 154(b) by 0 days.

(21) Appl. No.: 09/753,553

(22) Filed: Jan. 4, 2001

(51) Int. Cl.⁷ .................................................. H05K 7/20
(52) U.S. Cl. ........................ 361/704; 361/707; 361/709; 165/80.1; 165/80.2; 165/185; 174/16.3; 257/706; 257/712; 257/713
(58) Field of Search ................................. 361/682, 704, 361/707, 709, 710, 717–719; 257/675, 676, 706, 707, 712, 713; 174/16.3; 165/80.1, 80.2, 80.3, 185

(56) References Cited

U.S. PATENT DOCUMENTS

| | | | |
|---|---|---|---|
| 3,766,977 | * 10/1973 | Pravda et al. ........................... | 165/47 |
| 4,057,825 | * 11/1977 | Narita et al. ........................... | 257/720 |
| 5,710,745 | * 1/1998 | Getreuer .................................. | 369/13 |
| 5,940,273 | * 8/1999 | Fishman et al. ....................... | 361/704 |
| 6,107,711 | * 8/2000 | Borchert ............................... | 310/68 D |
| 6,254,423 | * 7/2001 | Lin ........................................ | 439/487 |

* cited by examiner

Primary Examiner—Leo P. Picard
Assistant Examiner—Boris L. Chervinsky
(74) Attorney, Agent, or Firm—Dougherty & Troxell

(57) ABSTRACT

A diode cooling arrangement includes a crystal having two end faces and two metal radiating fins respectively soldered to the end faces of the crystal, one radiating fin having two upright flanges at two opposite lateral sides adapted to hold the crystal in the centered position during the soldering procedure.

1 Claim, 2 Drawing Sheets

DIODE COOLING ARRANGEMENT

BACKGROUND OF THE INVENTION

The present invention relates to a diode and, more particularly, to a diode cooling arrangement, which facilitates the assembly and packing procedures and, increases the heat dissipation area.

FIG. 1 illustrates a diode cooling arrangement according to the prior art. According to this arrangement, the diode comprises a crystal 1', and two metal radiating fins 2' and 3' respectively soldered to two opposite end faces of the crystal 1'. The metal radiating fins 2' and 3' each have a leg for connecting to a respective contact at a substrate. Further, one metal radiating fin 3' has a front mounting hole for fastening to the substrate by a screw. Because the metal radiating fins 2' and 3' are flat members, it is difficult to hold the crystal 1' in position during the soldering procedure. When fastening to the substrate, the metal radiating fin 3' tends to be deformed and forced away from the crystal 1'. Further, because there is a big gap between the metal radiating fins 2' and 3', finished diodes will be in a tangle when put together. In order to prevent a tangle, finished diodes must be packed with an adhesive tape individually.

SUMMARY OF THE INVENTION

The present invention has been accomplished to provide a diode cooling arrangement, which eliminates the aforesaid drawbacks. It is one object of the present invention to provide a diode cooling arrangement, which does not deform easily during its mounting procedure. It is another object of the present invention to provide a diode cooling arrangement, which has means to hold the crystal in position during the soldering procedure. It is another object of the present invention to provide a diode cooling arrangement, which provides much heat dissipation area. It is still another object of the present invention to provide a diode cooling arrangement, which prevents a tangle when multiple finished diodes put together. According to the present invention, the metal radiating fin, which has a mounting hole for mounting, is provided with two upright flanges at two opposite lateral sides. The distance between the upright flanges is approximately equal to the diameter of the crystal so that the crystal can be positively secured in position during the soldering procedure. The upright flanges reinforce the structural strength of the respective metal radiating fin, and minimizes the gap between the metal radiating fins.

DETAILED DESCRIPTION OF THE PREFERRED EMBODIMENT

Figure 1:
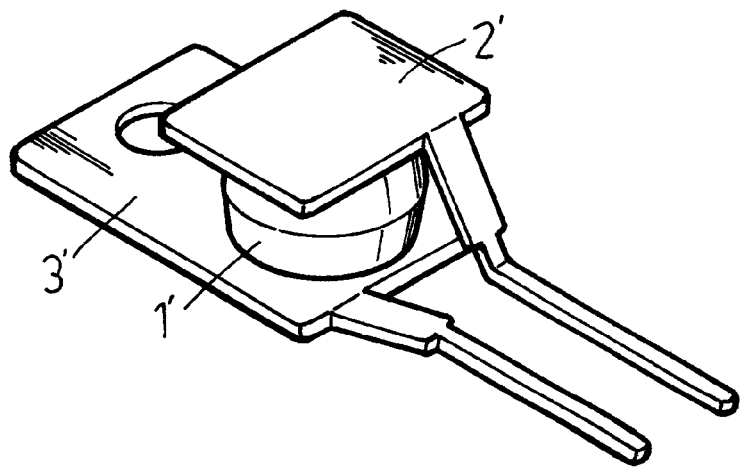
FIG. 1 is an elevational view of a diode constructed according to the prior art.
Figure 2:
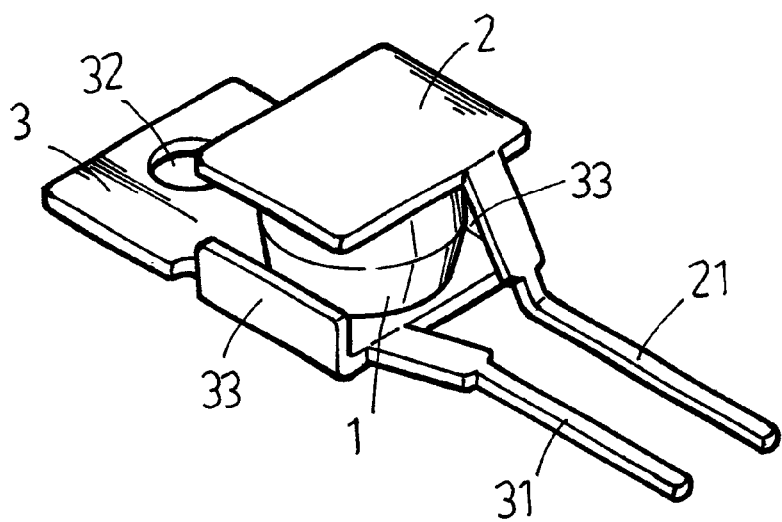
FIG. 2 is an elevational view of a diode constructed according to the present invention.

Referring to FIGS. from 2 through 4, a diode is shown comprised of a crystal 1, and two metal radiating fins 2 and 3. The crystal 1 has two end faces respectively covered with a layer of soldering paste 4. The metal radiating fins 2 and 3 are respectively welded to the soldering paste 4 at the two end faces of the crystal 1, each having a leg 21 or 31 disposed at the rear side for connection to a respective contact at an upper substrate (not shown). The second metal radiating fin 3 has a through hole 32 disposed at the front end for fastening to the substrate by a screw.

Referring to FIGS. from 2 through 4 again, the second metal radiating fin 3 comprises two upright flanges 33 at two lateral sides. The space between the upright flanges 33 is approximately equal to the diameter of the crystal 1 so that the crystal 1 can be positively supported on the second radiating fin 3 in the center position during the welding procedure. Further, the upright flanges 33 greatly reinforce the structural strength of the diode.

Figure 3:
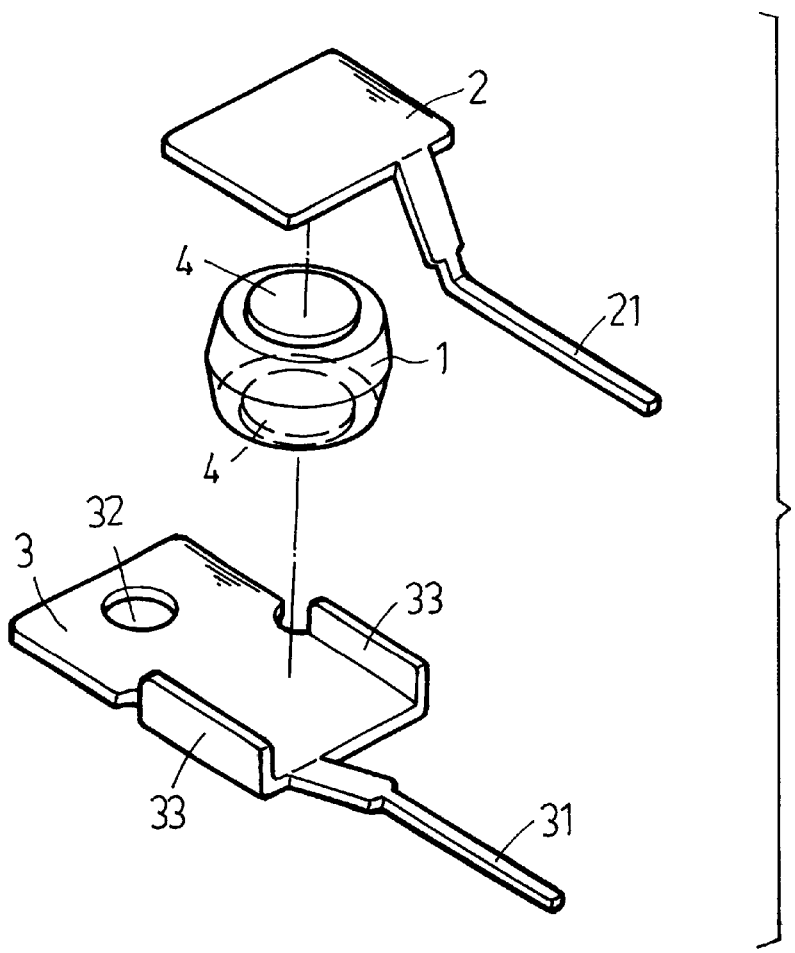
FIG. 3 is an exploded view of the diode shown in FIG. 2.
Figure 4:
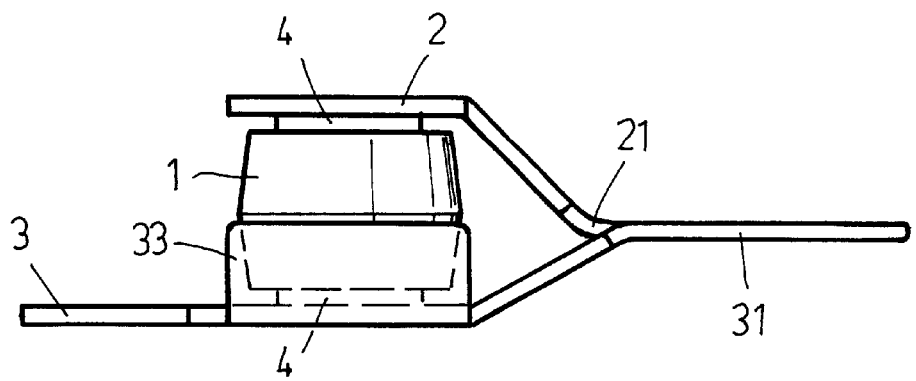
FIG. 4 is a side plain view of the diode shown in FIG. 2.

Referring to FIGS. 3 and 4 again, the crystal 1 is inserted in between the upright flanges 33 of the second metal radiating fin 3 with one soldering paste 4 covered end face disposed in contact with the top surface of the second metal radiating fin 3 and then soldered thereto, and then the first metal radiating fin 2 is welded to the other soldering paste 4 covered end face of the crystal 1.

The aforesaid upright flanges 33 not only reinforce the structural strength of the second metal radiating fin 3 and increase its heat dissipation area but also prevent tangling when multiple finished diodes are put together.

It is to be understood that the drawings are designed for purposes of illustration only, and are not intended for use as a definition of the limits and scope of the invention disclosed.

What the invention claimed is:

1. A diode cooling arrangement comprising a crystal, said crystal having two opposite end faces respectively covered with a layer of soldering paste, and a first metal radiating fin and a second metal radiating fins respectively soldered to the end faces of said crystal, said metal radiating fins each having a leg for connection to a respective contact at a substrate, wherein said second radiating fin comprises two upright flanges disposed at two opposite lateral sides in contact with the periphery of said crystal.

* * * * *